United States Patent
Zhao et al.

(10) Patent No.: US 9,945,025 B2
(45) Date of Patent: Apr. 17, 2018

(54) EVAPORATION COATING APPARATUS

(71) Applicant: BOE TECHNOLOGY GROUP CO., LTD., Beijing (CN)

(72) Inventors: Dejiang Zhao, Beijing (CN); Lu Wang, Beijing (CN); Seiji Fujino, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/768,587

(22) PCT Filed: Dec. 29, 2014

(86) PCT No.: PCT/CN2014/095378
§ 371 (c)(1),
(2) Date: Aug. 18, 2015

(87) PCT Pub. No.: WO2016/011779
PCT Pub. Date: Jan. 28, 2016

(65) Prior Publication Data
US 2016/0251751 A1 Sep. 1, 2016

(30) Foreign Application Priority Data

Jul. 21, 2014 (CN) .......................... 2014 1 0347668

(51) Int. Cl.
*C23C 14/24* (2006.01)
*C23C 14/26* (2006.01)

(52) U.S. Cl.
CPC ............ *C23C 14/243* (2013.01); *C23C 14/26* (2013.01)

(58) Field of Classification Search
CPC .................................................... C23C 14/22
(Continued)

(56) References Cited

U.S. PATENT DOCUMENTS 4,748,313 A * 5/1988 de Rudnay ............. C23C 14/28
118/726
6,830,626 B1 * 12/2004 Smith ................... C23C 14/243
118/724
(Continued)

FOREIGN PATENT DOCUMENTS

CN 1814854 A 8/2006
CN 101845612 A 9/2010
(Continued)

OTHER PUBLICATIONS

International Search Report of PCT/CN2014/095378 in Chinese, dated Apr. 24, 2015 with English translation.
(Continued)

*Primary Examiner* — Keath T Chen
(74) *Attorney, Agent, or Firm* — Collard & Roe, P.C.

(57) ABSTRACT

An evaporation coating apparatus comprising a heating unit (3) and a cylindrical member (1) disposed within the heating unit (3), wherein the cylindrical member (1) comprises a hollow sleeve (13) and a barrel (12) disposed at an inner side of the hollow sleeve (13) in a fitting manner; wherein a top end area of the hollow sleeve (13) is provided with a first evaporation hole (131), and an external surface of the hollow sleeve (13) is provided with an internal heater strip (4) connected to a control unit; wherein an external surface of the barrel (12) is provided with a groove (1') extending along an axial central line of the barrel (12), the groove (1') is provided with a plurality of compartments (11) arranged at interval space, and each of the compartments (11) is provided with a crucible (2); wherein the crucible (2) comprises a main body (21) which is disposed within the compartment (11) and sealed all around with one side opened, and a cover (22) which is connected to the main body (21) in a fitting manner and provided with a second evaporation hole (221) corresponding to the first evaporation hole (131); and
(Continued)

wherein the heating unit (3) has a hollow columnar structure, and an external surface of the heating unit (3) is provided with an external heater strip (5) and a nozzle (31) which is corresponding to the first evaporation hole (131). The evaporation coating apparatus is mainly configured to manufacture large-sized displays and can improve the uniformity of film-forming with organic material on the surface of the substrate.

14 Claims, 3 Drawing Sheets

(58) Field of Classification Search
USPC ................................................ 118/726, 727
See application file for complete search history.

(56) References Cited

U.S. PATENT DOCUMENTS

| | | | |
|---|---|---|---|
| 7,914,621 B2 | 3/2011 | Kim et al. | |
| 8,845,807 B2 | 9/2014 | Seo et al. | |
| 2003/0015140 A1 | 1/2003 | Van Slyke et al. | |
| 2005/0147753 A1* | 7/2005 | Smith | C23C 14/243 427/249.1 |
| 2005/0208220 A1* | 9/2005 | Long | C23C 14/12 427/255.6 |
| 2006/0027170 A1* | 2/2006 | Takeda | C23C 14/243 118/726 |
| 2007/0272156 A1* | 11/2007 | Noh | C23C 14/12 118/726 |
| 2009/0304906 A1* | 12/2009 | Suduo | C23C 14/12 427/8 |
| 2010/0159125 A1* | 6/2010 | Bruch | C23C 14/12 427/69 |
| 2010/0159132 A1 | 6/2010 | Conroy et al. | |
| 2011/0052796 A1* | 3/2011 | Gross | C23C 14/12 427/74 |
| 2011/0104398 A1* | 5/2011 | Korevaar | C23C 14/228 427/561 |
| 2012/0006267 A1* | 1/2012 | Pei | C23C 14/243 118/723 R |
| 2012/0027921 A1* | 2/2012 | Feldman-Peabody | C23C 14/0629 427/74 |
| 2013/0095256 A1* | 4/2013 | Hass | C23C 14/0635 427/578 |
| 2014/0335271 A1* | 11/2014 | Dempster | C23C 14/243 427/248.1 |
| 2015/0221897 A1* | 8/2015 | Kako | C23C 14/24 438/14 |

FOREIGN PATENT DOCUMENTS

| | | |
|---|---|---|
| CN | 102102175 A | 6/2011 |
| CN | 104178734 A | 12/2014 |
| EP | 1 254 969 A | 11/2002 |
| JP | 2011-60865 A | 3/2011 |
| WO | 2016/011779 A1 | 1/2016 |

OTHER PUBLICATIONS

Notice of Transmittal of the International Search Report of PCT/CN2014/095378 in Chinese, dated Apr. 24, 2015.
Written Opinion of the International Searching Authority of PCT/CN2014/095378 in Chinese, dated Apr. 24, 2015 with English translation.

* cited by examiner

EVAPORATION COATING APPARATUS

CROSS REFERENCE TO RELATED APPLICATIONS

This application is the National Stage of PCT/CN2014/095378 filed on Dec. 29, 2014, which claims priority under 35 U.S.C. § 119 of Chinese Application No. 201410347668.3 filed on Jul. 21, 2014, the disclosure of which is incorporated by reference.

TECHNICAL FILED

Embodiments of the present invention relate to an evaporation coating apparatus.

BACKGROUND

The technology of heating and evaporating an organic material under vacuum environment to form a film of the organic material onto a substrate is known as evaporation coating technology (evaporation coating for short), which appeals those skilled in the art for its advantageous such as wider range of application and low pollution.

Generally, an evaporation coating process utilizes a line source, usually a heater strip, as the heating source, so as to improve film-forming efficiency and material utilization. One of known processes applying the evaporation coating technology based on line source into Organic Light-Emitting Diode (OLED) products comprises steps of adding an organic material into a crucible having a size matched with that of a substrate; heating the organic material in the crucible by a heater strip surrounding or attaching onto a periphery of the crucible so that the organic material subject to heating can be uniformly evaporated onto a surface of the substrate disposed at an upper side of the crucible through a plurality of evaporation holes formed at a top end of the crucible, so as to complete the film-forming process of the substrate in an OLED product.

At present, OLED products are developing towards larger size, which results in larger and larger sized substrate, and correspondingly larger and larger sized crucible and hence longer and longer line source for heating. It's therefore more difficult to control, for example, a uniform temperature of the line source for a large sized substrate, which leads to a worse uniformity of film-forming with the organic material on the surface of the substrate.

SUMMARY

At least one embodiment of the present invention provides an evaporation coating apparatus comprising a heating unit and a cylindrical member disposed within the heating unit, wherein the cylindrical member comprises a hollow sleeve and a barrel disposed at an inner side of the hollow sleeve in a fitting manner; wherein a top end area of the hollow sleeve is provided with a first evaporation hole, and an external surface of the hollow sleeve is provided with an internal heater strip connecting to a control unit; wherein an external surface of the barrel is provided with a groove extending along an axial central line of the barrel, the groove is provided with a plurality of compartments arranged at interval space, and each of the compartments is provided with a crucible; wherein the crucible comprises: a main body which is disposed within the compartment and sealed all around with one side opened, and a cover which is connecting to the main body in a fitting manner and provided with a second evaporation hole corresponding to the first evaporation hole; and wherein the heating unit has a hollow columnar structure, and an external surface of the heating unit is provided with an external heater strip and a nozzle which is corresponding to the first evaporation hole.

In an example, the hollow sleeve has a columnar structure with a round-shaped cross section, the columnar structure is penetrated at both ends along an axial direction; the barrel has a U-shaped cross section; the plurality of compartments are uniformly arranged in the groove at equal space; and the compartment is defined by a spacing plate which is disposed in the groove and parallel to the axial central line of the barrel.

In an example, the crucible has a round-shaped cross section, and the main body has a U-shaped cross section which is coincident with that of the barrel; and a plurality of the first evaporation holes are arranged in rows along a longitudinal central line of the cylindrical member.

In an example, the second evaporation hole is disposed at an external side surface of the cover and is arranged to be adjacent to a top end of the cover; the first evaporation hole is disposed at an external side surface of the hollow sleeve and is arranged to be adjacent to a top end of the hollow sleeve.

In an example, an inner side of the barrel is provided with a condensing tube at a location corresponding to the compartment.

In an example, the nozzle has a cylindrical structure, and a plurality of the nozzles are arranged in rows along a longitudinal direction of the heating unit.

In an example, an upper end side of the heating unit is provided with a blocking plate.

In an example, two blocking plates are obliquely disposed at both sides of the nozzle.

In an example, the internal heater strip is uniformly winding around the external surface of the hollow sleeve at a location corresponding to the crucible; and the external heater strip is uniformly winding around the external surface of the heating unit.

In an example, the evaporation coating apparatus further comprises a crystal oscillator inductor at a location corresponding to the compartment or a location corresponding to a region between two adjacent compartments; the crystal oscillator inductor is connecting to the control unit and is configured to measure a velocity of evaporation coating.

BRIEF DESCRIPTION OF THE DRAWINGS

Embodiments of the present invention will be described in more detail below with reference to the accompanying drawings to enable those skilled in the art to understand the present invention more clearly, wherein.

REFERENCE NUMERALS

Figure 1:
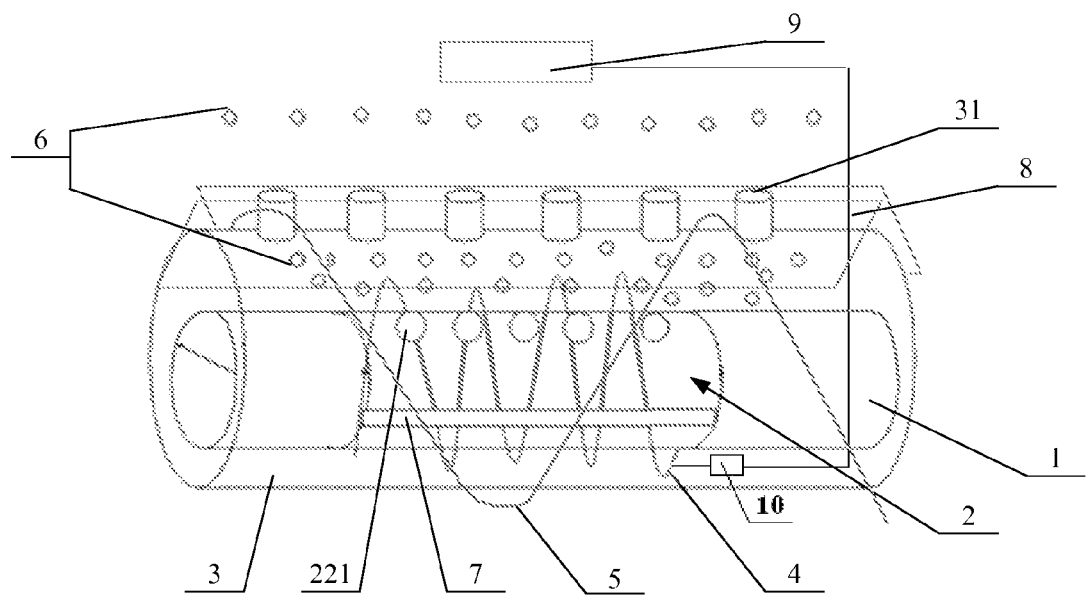
FIG. 1 is a schematically structural diagram of an evaporation coating apparatus as provided by an embodiment of the present invention.

1—cylindrical member; 1'—groove; 11—compartment; 111—spacing plate; 12—barrel; 13—hollow sleeve; 131—first evaporation hole; 2—crucible; 21—main body; 22—cover; 221—second evaporation hole; 3—heating unit; 31—nozzle; 4—internal heater strip; 5—external heater strip; 6—organic material; 7—condensing tube; 8—blocking plate; 9—crystal oscillator inductor; 10—control unit.

DETAILED DESCRIPTION OF THE PREFERRED EMBODIMENTS

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

Embodiments of the present invention provide an evaporation coating apparatus as illustrated in FIGS. 1-6 comprising a heating unit 3 and a cylindrical member 1 disposed within the heating unit 3. The cylindrical member 1 comprises a hollow sleeve 13 and a barrel 12 disposed at an inner side of the hollow sleeve 13 in a fitting manner, wherein a top end area of the hollow sleeve 13 is provided with a first evaporation hole 131; an external surface of the barrel 12 is provided with a groove 1' extending along an axial central line of the barrel 12, the groove 1' is provided with a plurality of compartments 11 arranged at interval space, and each of the compartments 11 of the barrel 12 is provided with a crucible 2; wherein the crucible 2 comprises: a main body 21 which is sealed all around with one side opened, and a cover 22 which is connecting to the main body 21 in a fitting manner and provided with a second evaporation hole 221 corresponding to the first evaporation hole 131; wherein an external surface of the cylindrical member 1 is provided with an internal heater strip 4 connecting to a control unit 10. The heating unit 3 has a hollow columnar structure on which an external heater strip 5 and a nozzle 31 are provided, wherein the nozzle 31 is corresponding to the first evaporation hole 131.

In the evaporation coating apparatus as provided by embodiments of the present invention, the plurality of crucibles in the plurality of compartments of the groove in the barrel are respectively heated by utilizing the independent internal heater strip disposed at locations corresponding to the plurality of compartments of the groove in the barrel under a control of the control unit, so that the organic material in the main body of the crucible is evaporated and flows out of the crucible on heating, and then distributed within the heating unit upon successively passing through the second evaporation hole in the cover of the crucible and the first evaporation hole in the hollow sleeve of the cylindrical member; subsequently, the organic material within the heating unit is entirely heated for a second time by the external heater strip disposed on the external surface of the heating unit and uniformly diffused onto the substrate through the nozzle disposed on the heating unit corresponding to the first evaporation hole, so as to complete the evaporation coating process. Since respective heating temperatures of the internal heater strip at respective locations corresponding to respective crucibles are individually controlled, it can ensure uniformly heating the crucibles so that the organic material corresponding to different locations of the substrate can be uniformly heated and evaporated; and since the organic material having been regionally evaporated is further heated and diffused entirely for a second time by the external heater strip, it can be recombined for the second time and then intensely diffused so as to further improve the uniformity of film-forming with organic material on the surface of the substrate. In this way, the technical problem of the existing technology that the longer and longer line source for heating leads to a worse uniformity of film-forming with organic material on the surface of the substrate.

Figure 2:
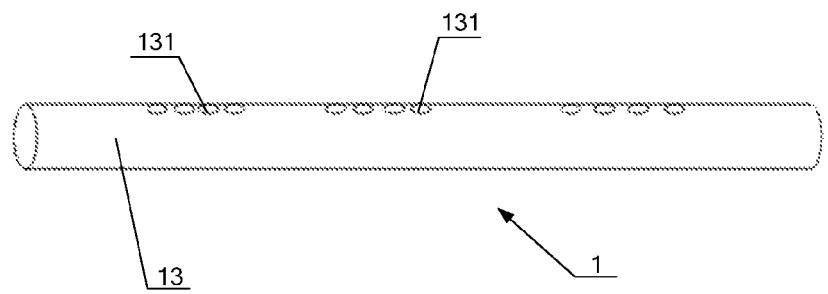
FIG. 2 is a schematically structural diagram of a hollow sleeve of a cylindrical member in the evaporation coating apparatus as provided by the embodiment of the present invention.
Figure 3:
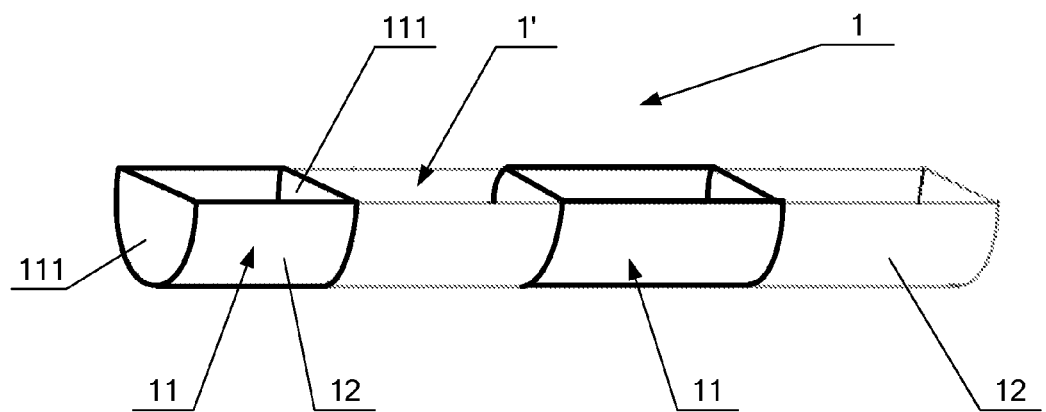
FIG. 3 is a schematically structural diagram of a barrel of the cylindrical member in the evaporation coating apparatus as provided by the embodiment of the present invention.
Figure 4:
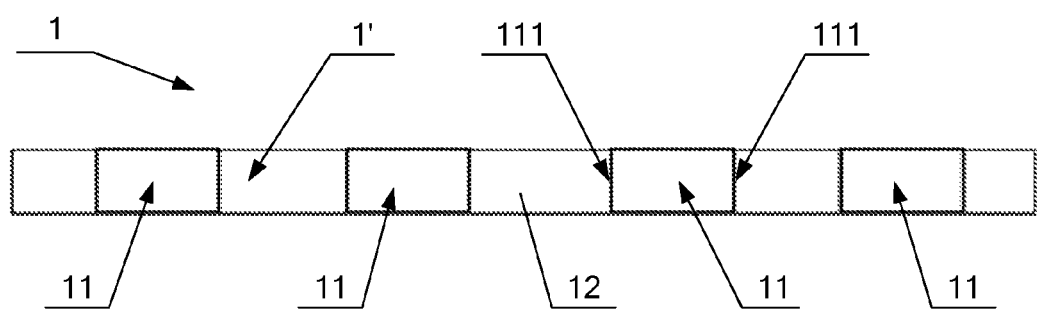
FIG. 4 is a top view of the cylindrical member in the evaporation coating apparatus as provided by the embodiment of the present invention.
Figure 6:
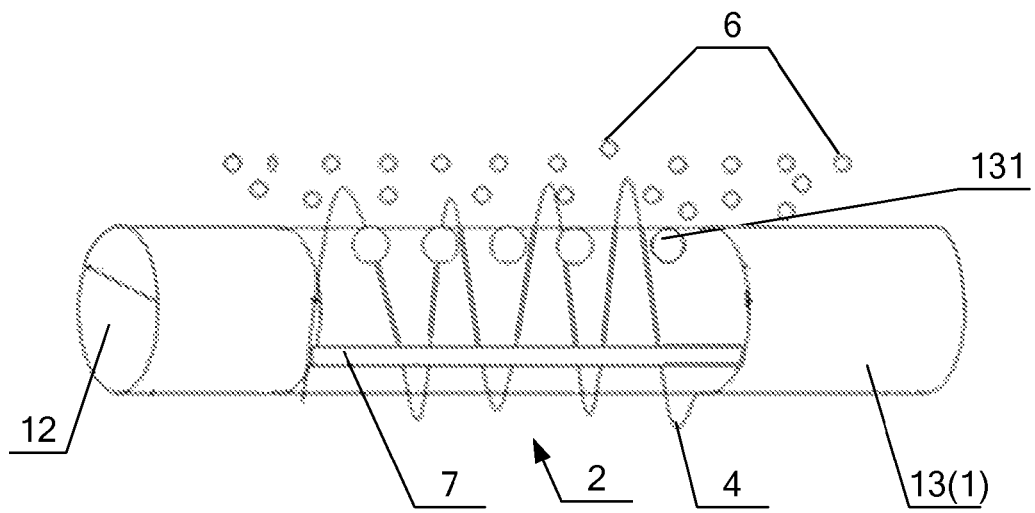
FIG. 6 is a schematically structural diagram illustrating a single evaporation coating.

Herein it should be explained that FIG. 1 and FIG. 6 merely illustrate a partial structure at a location corresponding to only one crucible, and the evaporation coating apparatus as provided by embodiments of the present invention is constituted by several structures as illustrated in FIG. 1; similarly, FIGS. 2-4 merely illustrate a partial structure of the hollow sleeve and the barrel of the cylindrical member, and detailed specification of the evaporation coating apparatus as provided by embodiments of the present invention in actual implementation can be adjusted according to different production conditions. Additionally, the numbers of the compartments in the barrel of the cylindrical member and the distance between two adjacent compartments in the drawings are illustrated by way of example only, and should be reasonably designed in actual implementation so as to prevent the arrangement of the compartments from influencing the film-forming during the evaporation coating process. In an example, the above-mentioned hollow sleeve 13, barrel 12, heating unit 3 as well as internal heater strip 4 and external heater strip 5, respectively, can be formed of a material such as tungsten, molybdenum and tantalum, for example, stranded tungsten wire, without limiting the present invention thereto.

In an example, in order to facilitate entirely placing a plurality of crucibles into the heating unit 3 by a single step and meanwhile ensuring the stability of the placement, as illustrated in FIG. 2, the hollow sleeve 13 of the cylindrical member 1 has a columnar structure with a round-shaped section, and the columnar structure is penetrated at both ends along an axial direction so as to facilitate inserting the barrel 12 received with a plurality of crucibles 2 into the hollow sleeve 13.

In an example, in order to save cost and also reduce materials as utilized, as illustrated in FIG. 3, the barrel 12 has a U-shaped cross section, that is, an upper end of the barrel 12 is opened; at the same time, the structure of the barrel 12 also facilitates placing the crucible 2 into the barrel 12 and taking the crucible 2 out of the barrel 12. Of course, the present invention is not limited to those described herein, and the cylindrical member 1 can have other structures, for example, the cross section of the barrel 12 of the cylindrical member 1 can have a shape of rectangular with an opened side.

In an example, in order to ensure a match between structures of the crucible 2 and of the barrel 12 of the cylindrical member 1 and in order to ensure an entirely uniform heating of the crucibles 2 so as to eliminate any corner area which may influence the heating effect, the crucible 2 can have a round-shaped cross section in case where the barrel 12 has a U-shaped cross section; for example, the crucible 2 can comprise a main body 21 and a cover 22, as illustrated in FIG. 3, the main body 21 of the crucible 2 can have a U-shaped cross section coincident with that of the barrel 12 so as to ensure well contact between the main body 21 and the barrel 12 of the cylindrical member 1 during placing the main body 21 into the compartment 11, thereby ensuring well thermal conductivity and stability there-between. In an example, in order to conveniently adding the organic material 6 into the crucible 2, the main body 21 and the cover 22 of the crucible 2 can be hinged with each other so that it only needs to pull the cover 22 to add the organic material 6 into the crucible 2, which is a simple operation. In an example, the main body 21 and the cover 22 of a single crucible 2 can be formed of ceramic material such as boron nitride and aluminium oxide. Of course, the present invention is not limited to those described herein.

In an example, in order to uniformly and sufficiently diffuse the organic material 6, as illustrated in FIG. 2, the hollow sleeve 13 of the cylindrical member 1 can be provided with a plurality of first evaporation holes 131 arranged in rows along a central line of the cylindrical member 1.

In an example, in order to uniformly forming a film with the organic material 6 onto the surface of the substrate by cooperating with a reasonable distribution of the crucibles 2 in the cylindrical member 1, as illustrated in FIG. 4, the compartments 11 (the portions described by thick lines in FIG. 4) can be uniformly arranged at equal space in the groove 1'. Of course, the present invention is not limited thereto; instead, the arrangement of the compartments 11 can be reasonably adjusted according to, for example, actual production conditions. For example, as illustrated in FIG. 3, each of the compartments 11 (the portions described by thick lines in FIG. 3) can be defined by two spacing plates 111 which are arranged in parallel to the cross section of the barrel 12.

Figure 5:
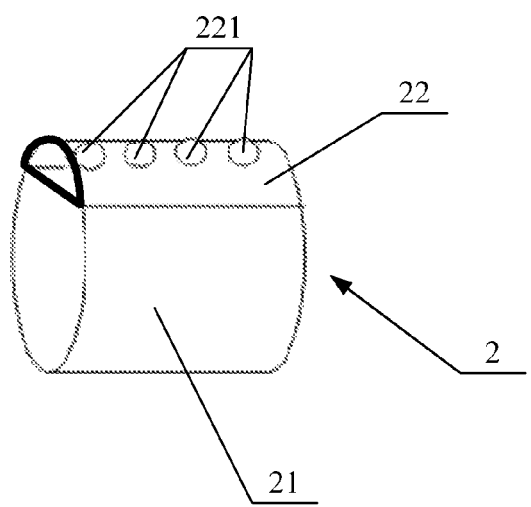
FIG. 5 is a schematically structural diagram of a crucible in the evaporation coating apparatus as provided by the embodiment of the present invention.

Herein it should be explained that, considering the distinction between different types of organic materials 6 in their properties and material process states, it usually avoids completely filling the crucible 2 with the organic material 6 but remaining a certain space, so as to allow the organic material 6 being added at a certain amount to fully fill the main body 21 without contacting with the cover 22. For this end, in an example, the cover 22 can have an arc-shaped structure with a bottom side thereof being opened and other three sides being sealed; as illustrated in FIG. 5, the side enclosed by thick lines and the side opposite thereto are both sealed so that the portion of the cover 22 contacting with the main body 21 has a closed structure. In an example, in order to save cost, the cover 22 can also have another arc-shaped structure with one side being sealed and the other three sides being opened, as illustrated in FIG. 5, the side enclosed by thick lines and the side opposite thereto, as well as the bottom side of the cover 22 are all opened.

In an example, as illustrated in FIG. 5 and FIG. 6, the above-mentioned second evaporation hole 221 can be disposed at a side surface of the cover 22 and be adjacent to a top end of the cover 22. For example, each of the crucibles 2 can be provided with total 8 evaporation holes 221 which are arranged in two rows, with each row having 4 evaporation holes 221; and the two rows of evaporation holes 221 are disposed at both side surfaces of the cover 22 respectively and are adjacent to the top end of the cover 22; correspondingly, the first evaporation holes 131 of the cylindrical member 1 can be disposed at a side surface of the hollow sleeve 13 and be adjacent to a top end of the hollow sleeve 13; the numbers and distribution manner of the first evaporation holes 131 can be arranged corresponding to that of the second evaporation holes 221, that is, arranged in a 4*2 array. Such arrangement allows the organic material 6 that is evaporated and flows out of the crucibles 2 and the cylindrical member 1 to be diffused and distributed throughout an upper area in the heating unit 3 more uniformly and sufficiently, thereby achieving better effect of dispersing.

In an example, in order for better control of the temperature at which the organic material 6 is heated, as illustrated in FIG. 1, an inner side of the barrel 12 of the cylindrical member 1 can be provided with a condensing tube 7 at a location corresponding to the compartment 11; so as to ensure stably maintaining the temperature at which the organic material 6 is evaporated within a reasonable range by combining a warming effect of the internal heater strip 4 disposed at locations on the external surface of the cylindrical member 1 corresponding to the compartments 11 with a cooling effect of the above-mentioned condensing tube 7. In an example, an inner side of the barrel 12 can be provided with a groove in which the condensing tube 7 is received so as to prevent the condensing tube 7 from hindering the placement of the crucible 2 into the compartment 11, that is, the condensing tube 7 is located between the crucible 2 and an inner side of the barrel 12. The numbers and location of the condensing tube 7 in the embodiments of the present invention can be arranged flexibly according to actual demands. In an example, it's provided with two condensing tubes 7, which are disposed at both sides of a central point of the barrel 12, for example.

In an example, in order to facilitate manufacturing, as illustrated in FIG. 1, a plurality of cylindrical-shaped nozzles 31 can be disposed on the heating unit 3; for example, the heating unit 3 can be provided with 6 nozzles 31 at locations corresponding to the first evaporation holes 131 of the cylindrical member 1; and the plurality of nozzles 31 can be arranged in rows along the extending direction of the heating unit 3 at equal space; so that the organic material 6 in the crucible 2 can be evaporated on heating by the internal heater strip 4, and diffused into the heating unit 3 through the first and second evaporation holes (131, 221), then further distributed uniformly by a second heating of the external heater strip 5, and finally uniformly deposited onto the surface of the substrate through the nozzle 31.

In an example, in order to prevent the temperature of the evaporation coating apparatus from influencing the temperature of the substrate, as illustrated in FIG. 1, the upper end side of the heating unit 3 can be further provided with a blocking plate 8. For example, in order to enhance the thermal insulation effect, the blocking plate 8 can be a thermal radiation-shielding plate; for example, it can be provided with 2 blocking plates 8 which are obliquely disposed at both sides of the nozzle 31 respectively; in addition, the two blocking plates 8 have a gap there-between to avoid blocking the nozzle 31, so that the organic material diffused through the nozzle 31 can smoothly pass through the gap and be deposited onto the surface of the substrate.

In an example, in order to ensure a stable and uniform heating effect of the entire evaporation coating apparatus, as illustrated in FIG. 1, the internal heater strip 4 is uniformly winding around the external surface of the hollow sleeve 13 of the cylindrical member 1, with several winding sections thereof being corresponding to locations of the crucibles 2 in the barrel 12, respectively; and the external heater strip 5 is uniformly winding around the external surface of the heating unit 3. For example, the internal heater strip 4 can be winding in such a manner that it closely attaches onto the external surface of the hollow sleeve 13, or in such a manner that it leaves a certain gap with the external surface of the hollow sleeve 13. Similarly, the external heater strip 5 can be winding in such a manner that it closely attaches onto the external surface of the heating unit 3, or in such a manner that it leaves a certain gap with the external surface of the heating unit 3. The manner of "closely attaching" can save the space while the manner of "leaving a gap" can transfer the heat uniformly; in actual implementation, it can choose either of the two manners or reasonably combine the two manners to achieve optimal evaporation coating status.

Herein it should be explained that, in order to prevent the organic material 6 from attaching onto the cylindrical member 1 which may result in waste of material, both the cylindrical member 1 and the crucible 2 are heated by the internal heater strip 4.

In an example, in order to measure an evaporation velocity of the organic material 6 and feeds back the same to the control unit 10, as illustrated in FIG. 1, at a location corresponding to the compartment 11 and a location corresponding to a region between two adjacent compartments 11, the evaporation coating apparatus as provided by embodiments of the present invention can further comprise a crystal oscillator inductor 9 connecting to the control unit 10; the crystal oscillator inductor 9 is configured to measure a velocity of evaporation coating so as to determine a degree of uniformity thereof and feeds back the same to the control unit 10; in this way, the control unit 10 can further control and regulate the velocity and also the degree of uniformity of the evaporation coating by jointly controlling and regulating the heating temperatures of the internal heater strip 4, so as to ensure the entire uniformity of film-forming on the substrate. Of course, in order to facilitate controlling, it can provide the crystal oscillator inductor 9 at the location corresponding to the compartment 11 only. The implementation and working principle of the crystal oscillator inductor 9 both belong to mature technology in the related art and hence will not be defined or described in details herein.

Hereinafter the evaporation coating process by using the evaporation coating apparatus as provided by embodiments of the present invention are described in details with reference to FIG. 1.

First of all, adding an organic material 6 into several crucibles 2 respectively, and placing the several crucibles 2 into compartments 11 in the barrel 12 of the cylindrical member 1 respectively; then inserting the entire barrel 12 carried with the several crucibles 2 into the hollow sleeve 13 of the cylindrical member 1; then placing the cylindrical member 1 along with these crucibles 2, as a whole, into the heating unit 3; afterwards, through a control unit 10, controlling the internal heater strip 4 to heat the cylindrical member 1 and the crucibles 2 to allow the organic material 6 to be evaporated and diffused into an internal of the heating unit 3 upon successively passing through the second evaporation hole 221 and the first evaporation hole 131; finally, heating the heating unit 3 by the external heater strip 5 to allow the organic material 6 that has been evaporated for a first time to be uniformly evaporated and diffused for a second time and be uniformly deposited onto the surface of the substrate through the nozzle 31.

Herein it should be explained that the entire cylindrical member 1 has a retain temperature so as to prevent the organic material 6 from depositing onto the external surface of the cylindrical member 1; and the heating unit 3 also has a retain temperature so as to prevent the organic material 6 from congealing and hence blocking the nozzle 31.

The evaporation coating apparatus as provided by embodiments of the present invention regionally heats and evaporates the organic material for a first time, then intensively evaporates and diffuses the organic material for a second time and meanwhile integrally controlling the evaporation velocity, so as to improve the uniformity of film-forming during the evaporation coating process; besides, the crucibles can be entirely replaced by replacing the cylindrical member, which simplifies the operation and also saves the space, thereby reducing the maintenance time and the operating costs.

It is understood that the described above are just exemplary implementations and embodiments to explain the principle of the present invention and the invention is not intended to limit thereto. An ordinary person in the art can make various variations and modifications to the present invention without departure from the spirit and the scope of the present invention, and such variations and modifications shall fall in the scope of the present invention.

The present application claims the priority of China patent application No. 201410347668.3 filed on Jul. 21, 2014 titled "EVAPORATION COATING APPARATUS", which is incorporated herein by reference in its entirely.

What is claimed is:
1. An evaporation coating apparatus comprising a heating unit and a cylindrical member disposed within the heating unit, wherein,
the cylindrical member comprises a hollow sleeve and a barrel disposed at an inner side of the hollow sleeve in a fitting manner; wherein a top end area of the hollow sleeve is provided with a first evaporation hole, and an external surface of the hollow sleeve is provided with an internal heater strip connected to a control unit; wherein an external surface of the barrel is provided with a groove extending along an axial central line of the barrel, the groove is provided with a plurality of compartments arranged at interval space, wherein the interval space between the compartments is adjustable, and each of the compartments is provided with a crucible in such a manner that the crucibles are arranged to be spaced by at least one compartment; wherein the crucible comprises a main body which is disposed within the compartment and sealed all around with one side opened, and a cover which is connected to the main body in a fitting manner and provided with a second evaporation hole corresponding to the first evaporation hole; and the heating unit has a hollow columnar structure, and an external surface of the heating unit is provided with an external heater strip and a nozzle which corresponds to the first evaporation hole, wherein the internal heater strip is uniformly winded around the external surface of the hollow sleeve at a location corresponding to the crucible; and the external heater strip is uniformly winded around the external surface of the heating unit.

2. The evaporation coating apparatus of claim 1, wherein the hollow sleeve has a columnar structure with a round-shaped cross section, the columnar structure is penetrated at both ends along an axial direction;

the barrel has a U-shaped cross section, and the plurality of compartments is uniformly arranged in the groove at equal space; and the compartment is defined by a spacing plate which is disposed in the groove and parallel to the axial central line of the barrel.

3. The evaporation coating apparatus of claim 2, wherein the crucible has a round-shaped cross section, and the main body has a U-shaped cross section which is coincident with that of the barrel; and a plurality of the first evaporation holes is arranged in rows along a longitudinal central line of the cylindrical member.

4. The evaporation coating apparatus of claim 3, wherein the second evaporation hole is located at an external side surface of the cover and is arranged to be adjacent to a top end of the cover; and the first evaporation hole is located at an external side surface of the hollow sleeve and is arranged to be adjacent to a top end of the hollow sleeve.

5. The evaporation coating apparatus of claim 4, wherein, an inner side of the barrel is provided with a condensing tube at a location corresponding to the compartment.

6. The evaporation coating apparatus of claim 3, wherein, an inner side of the barrel is provided with a condensing tube at a location corresponding to the compartment.

7. The evaporation coating apparatus of claim 2, wherein, an inner side of the barrel is provided with a condensing tube at a location corresponding to the compartment.

8. The evaporation coating apparatus of claim 1, wherein, an inner side of the barrel is provided with a condensing tube at a location corresponding to the compartment.

9. The evaporation coating apparatus of claim 1, wherein the nozzle has a cylindrical structure; and a plurality of the nozzles is arranged in rows along a longitudinal direction of the heating unit.

10. The evaporation coating apparatus of claim 9, wherein an upper end side of the heating unit is provided with a blocking plate.

11. The evaporation coating apparatus of claim 10, wherein two blocking plates are obliquely disposed at both sides of the nozzle.

12. The evaporation coating apparatus of claim 1, further comprising a crystal oscillator inductor at a location corresponding to the compartment or a location corresponding to a region between two adjacent compartments; and the crystal oscillator inductor is connected to the control unit and is configured to measure a velocity of evaporation coating.

13. The evaporation coating apparatus of claim 1, wherein the cover is formed to have an arc-shaped structure with a bottom side thereof being opened and other three sides being sealed, and the cover is formed of boron nitride or aluminium oxide.

14. The evaporation coating apparatus according to claim 1, wherein the compartments are arranged with equal spacing from each other.

* * * * *